United States Patent [19]
Kiko

[11] 3,848,195
[45] Nov. 12, 1974

[54] DIFFERENTIAL AMPLIFIER WITH DYNAMIC BIASING

[75] Inventor: Frederick John Kiko, Sheffield Village, Ohio

[73] Assignee: Bell Telephone Laboratories, Incorporated, Murray Hill, Berkeley Heights, N.J.

[22] Filed: Mar. 12, 1973

[21] Appl. No.: 340,587

[52] U.S. Cl. ................ 330/30 D, 330/40, 332/11 D
[51] Int. Cl. ............................................ H03f 3/68
[58] Field of Search ......... 330/22, 29, 30 D, 40, 69, 330/136; 332/11 D; 325/38 R, 38 B, 41

[56] References Cited

UNITED STATES PATENTS 3,521,179 7/1970 Blancke .......................... 330/40 X

OTHER PUBLICATIONS

Younge, "Bootstrapping Bias Supply Increases IC Voltages Capacity," Electronics, Oct. 28, 1968, pp. 90, 91.
"uA709C High Performance Operational Amplifier," Publication of Fairchild Semiconductor, Oct. 65.

*Primary Examiner*—James B. Mullins
*Attorney, Agent, or Firm*—John P. McDonnell; Daniel D. Dubosky

[57] ABSTRACT

The differential amplifier current folder circuit of the present invention employs dynamic biasing to provide supplemental bias currents to the collector-emitter paths of the differential amplifier transistors in proportion to the magnitude of the input signal. Since the bias current through the main coding path comprising the coding and weighting network is thus determined only by the magnitude of the input signal and not by the magnitude of a bias current predetermined in accordance with expected peak magnitude input signals, the IΔR voltage drop and leakage currents in the folder circuit are proportional to the magnitude of the input signal. Lower magnitude input signals can thus be coded with a minimum of error using either thin film techniques or components readily available from commercial sources.

12 Claims, 1 Drawing Figure

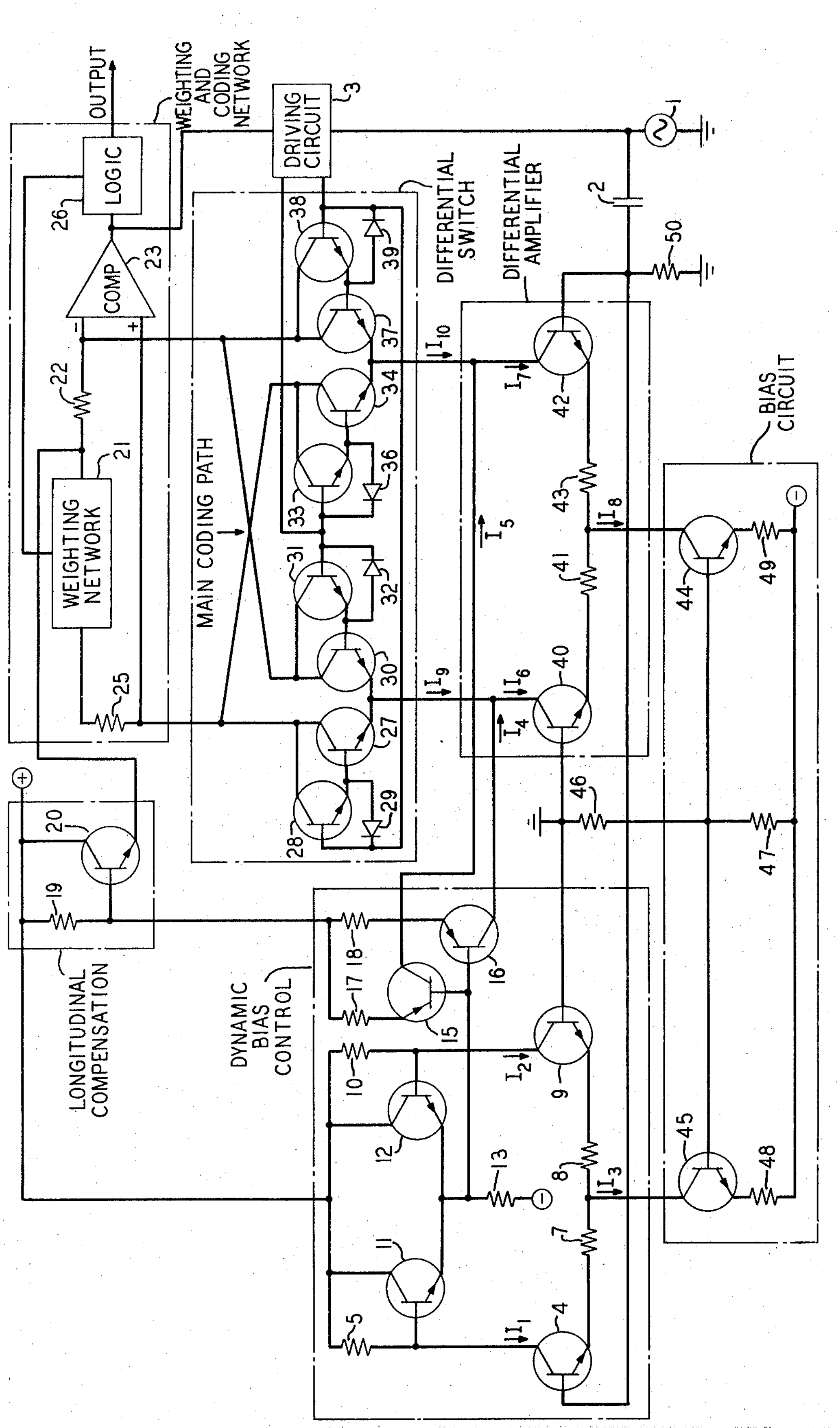
OUTPUT
WEIGHTING AND CODING NETWORK
LOGIC
COMP
WEIGHTING NETWORK
DRIVING CIRCUIT
DIFFERENTIAL SWITCH
DIFFERENTIAL AMPLIFIER
MAIN CODING PATH
BIAS CIRCUIT
LONGITUDINAL COMPENSATION
DYNAMIC BIAS CONTROL

DIFFERENTIAL AMPLIFIER WITH DYNAMIC BIASING

BACKGROUND OF THE INVENTION

This invention relates to differential amplifier circuits and, more particularly, to differential amplifier circuits adapted for use in a current switched folder and coder circuit.

In PCM (pulse code modulation) communications systems, continuous time varying information signals such as electrical speech signals may be represented by a series of ON and OFF pulses. The analog-to-digital conversion is accomplished by periodically sampling, quantizing, and encoding the amplitude of each of the samples into a binary code word. In the quantizing process, the exact level of the time varying input signal is approximated by one of a number of discrete values called quantum levels. The difference between the instantaneous value of the input signal and the quantum level actually transmitted is called quantizing error and gives rise to what is known as quantizing distortion.

Quantizing distortion is especially objectionable and very often intolerable when the instantaneous value or magnitude of the input signal is small but is usually of little or no significance when the instantaneous magnitude of the input signal is high. For higher quality and more effective transmission it is therefore desirable to have significantly more samples of the lower amplitudes of the lower input signal and relatively less samples at the higher amplitudes of the input signal. The undesirable effects of quantizing error are thus reduced by reducing the magnitude of the quantizing error for lower magnitudes of the input signal where quantizing distortion would be a serious matter at the price of increased quantizing error for the higher amplitudes of the input signal where the increased distortion can be tolerated.

Since the input analog signals to be coded normally have positive and negative portions symmetrical around the zero or time axis, further quantizing accuracy can be obtained by "folding" one portion of the input signal about the zero axis in a manner similar to which a full wave rectifier folds negative half sinusoids of the a.c. input signal between positive half sinusoid inputs. The advantages of the folding are obvious. For example, for a coder having 256 quantum levels and a peak signal of +3 to −3 volts, folding the negative portions of the input signal permits the use of only 128 levels (plus polarity) to code a signal over a range of 3 volts (0 to +3 volts) rather than generating 256 levels to code the signal over a range of 6 volts (+3 to −3 volts).

A folder circuit that might be employed for this folding and coding process would employ a constant current source bias circuit, a differential amplifier, a differential switch, and a matched resistor-weighting network structure all connected in a serial path. The input signal to be coded would be connected to the differential amplifier and the output, which is connected to a comparator and logic circuit, would be taken from the weighting network-resistor combination. The weighting network might typically be a resistive ladder network controlled by the logic circuit to provide stepped voltage or current references against which the signals across the matched resistors are compared for coding purposes. The differential switch is driven by a network synchronized and zero-set with the polarity and frequency of the input signal to provide the desired folding action. Since the current through the resistor weighting network combinaton, differential switch, and differential amplifier is always constant, any variations between the matched components, such as variations in resistance between the matched resistors of the coding network, introduces an error in the folding process which is constant (i.e., the constant biasing current times the ΔR variations in the resistors produces a ΔV error voltage). This constant error presents no problem for input signals of larger magnitudes where the distortion can be tolerated but is quite serious for lower magnitudes of input signals, as discussed heretofore in connection with quantizing error.

The ability to code lower magnitudes of input signal requires that the error introduced by the folding process necessarily be limited to voltage magnitudes significantly less than the magnitude of the smallest quantum level. For the example of 256 non-linear quantum levels used before this requires a folding accuracy of 4,000 to one. With the accuracy of the coded constant error introduced by the variations in the coding and biasing resistors, for example, becomes a major obstacle. For the illustration of 256 quantum levels, a resistor accuracy of 0.01 percent or better would be required to achieve the desired coding accuracy. Such accuracy is, at the present state of the art, impractical to achieve or maintain. The result of using components presently obtainable is coding inaccuracy which in turn results in signal crossover distortion and high idle circuit noise.

In my copending application, Ser. No. 340,267, filed on Mar. 12, 1973 concurrently with this application, I disclose a current folder and coder circuit with dynamic bias control of the bias current through the differential amplifier transistors in accordance with the magnitude of the input signal. Although this arrangement has been found to be quite satisfactory for most applications, varying the bias current through the differential amplifier transistors causes the gain of these transistors to vary and in turn effects signal linearity.

It is therefore an object of this invention to provide a current folder circuit that achieves the desired coding accuracies using components readily available from commercial sources.

It is another object of this invention to achieve the desired coding accuracy with commercially available components while maintaining a high degree of signal linearity.

SUMMARY OF THE INVENTION

The differential amplifier current folder circuit of the present invention employs dynamic biasing for the collector-emitter currents of the differential amplifier transistors in inverse proportion to the magnitude of the input signal. Since the bias current through the main coding path is thus determined only by the magnitude of the input signal, and not by the magnitude of a bias current predetermined in accordance with expected peak magnitude input signals, the IΔR voltage drop and leakage base currents in the folder circuit are proportional to the magnitude of the input signal. Thus the error remains approximately the same as for the aforenoted constant bias structures for higher magnitudes of input signal where the error can be tolerated, but is appreciably reduced for lower magnitudes of input signal to a level where it can be easily tolerated. The reduction in the error for lower magnitudes of input signal permits the use of thin film components as well as components readily available from commercial sources at no sacrifice in signal linearity.

In the current folder and coder circuit of the present invention, first and second transistors are d.c. biased for operation as a differential amplifier with one of the transistors connected to receive the input signal. The collector-emitter paths of these transistors are connected in parallel by a differential switch and the weighting and coding network to a source of bias potential. A dynamic bias control network is connected to the source of bias and to the collector-emitter paths of each of the differential amplifier transistors to provide bias current to the collector-emitter paths of each of the transistors. The dynamic bias control network is also connected to the input signal source to control inversely the magnitude of additional current supplied to the collector-emitter paths of the differential amplifier transistors in accordance with the magnitude of the input signal.

Except for the dynamic bias control circuit, the present current folder and coder circuit, discussed in detail hereinafter, thus comprises a serially connected source of biasing potential, a weighting and coding network, a differential switch, a differential amplifier, and a bias circuit which maintains a constant current. The dynamic bias control circuit also comprises a differential amplifier, full-wave rectification and signal combining transistor, and a pair of bias control transistors having their collector-emitter paths connected between the source of bias and the collector electrodes of respective ones of the differential amplifier transistors in the main coding path. In the dynamic bias control network the differential amplifier is responsive to the magnitude of the input signal and in turn drives the full-wave rectifier transistors thereby causing a proportional current flow through the level shifting transistors. The emitter electrodes of the level shifting rectifier transistors are interconnected with the base electrodes of the bias controlling transistors supplying the additional currents to the transistors of the differential amplifier in the main coding paths. A peak signal input to the dynamic control network causes the bias control transistors supplying the additional current to be back-biased and only a negligible additional current flows through these transistors for this condition. A small input signal magnitude, however, causes a relatively large additional current flow through the bias control transistors and permits only a small current to flow through the weighting and coding network and differential switch in the main coding path; the current at the junction of the emitter electrodes of the differential amplifier in the main coding path being maintained at a constant value. Dynamic biasing is thus provided.

Longitudinal compensation is also provided in the current folder circuit of the present invention to compensate for large voltage swings which translate from longitudinal to transverse voltages in the weighting and coding network. This network is connected between the weighting and coding network and the source of positive bias potential to compensate for the large voltage swings that would occur in the potential across the coding network due to an abrupt change of current through the coded network as, for example, that which might be caused by the sudden presence of a large magnitude input signal.

BRIEF DESCRIPTION OF THE DRAWING

Other objects and features of the present invention will be apparent from the following discussion and drawing, the single feature of which is a current switched folder and coder embodiment of the dynamically biased differential amplifier of the present invention.

DETAILED DESCRIPTION

The current folder and coder circuit employing the present invention illustrated in the drawing comprises six basic networks shown in dotted enclosures, namely: the longitudinal compensation circuit, the weighting and coding network, the differential switch, the differential amplifier, and the bias circuit, and the dynamic bias control circuit.

As illustrated in the drawing, the input signal to be folded and coded, designated as an input source 1, is coupled by a capacitor 2 to the inputs of both the dynamic bias control network and the differential amplifier and is connected directly to the driving circuit 3, the outputs of this latter circuit being connected to the differential switch. The input to the dynamic bias control network is applied to the base electrode of the transistor 4. The collector electrode of transistor 4 is connected via resistor 5 to a source of positive bias potential. A resistor 7 is connected to the emitter electrode of transistor 4 and to a resistor 8, the latter of which is in turn connected to the emitter electrode of transistor 9 of the dynamic bias control network. Resistors 7 and 8 may be of equal value. The base electrode of transistor 9 is connected to ground and its collector is connected via a resistor 10 to the source of positive bias potential. Transistor 11 of the bias control network has its base electrode connected to the collector electrode of transistor 4 and its collector electrode connected directly to the source of positive biasing potential. The base electrode of transistor 12 is connected to the collector electrode of transistor 9 and also has its collector electrode connected directly to the source of positive bias potential. The emitter electrodes of full-wave rectifier transistors 11 and 12 are connected by a common resistor 13 to a source of negative bias potential. The base electrodes of transistors 15 and 16 of the dynamic bias control network are connected to the common emitter connection of transistors 11 and 12. Resistor 17 is connected to the emitter electrode of transistor 15 and resistor 18 is connected to the emitter electrode of transistor 16, these resistors being interconnected via resistor 19 of the longitudinal compensation circuit to the source of positive bias potential. Transistor 20 of the longitudinal compensation circuit has its base and collector electrodes connected across resistor 19 and its emitter electrode connected to the weighting and coding network.

Weighting network 21 of the weighting and coding network, the function of which will be discussed hereinafter, is connected to the emitter electrode of transistor 20 of the longitudinal compensation circuit. Resistor 22 connects the emitter electrode of transistor 20 to the negative input terminal of the comparator 23. The output of the comparator 23 is connected to the driving circuit 3 to synchronize the driving signal with the polarity of the compared signal to be coded. Resistor 25 represents the source impedance of the weighting network 21 and is connected to the positive input terminal of comparator 23. A logic circuit 26 is connected to the output of the comparator 23, the output of the folder and coder circuit, and to the weighting network 21.

The differential switch comprises four pairs of transistors connected as Darlington pairs. Thus, transistors 27 and 28 of the differential switch have their collector electrodes interconnected with the emitter electrode of transistor 28 connected to the base electrode of transistor 27. The base electrode of transistor 28 is connected to the driving circuit 3 and a switching speed-up diode 29 is connected for forward conduction from the emitter to base electrodes of transistor 28. Diode 29 also provides a path for transistor leakage currents to prevent coding inaccuracies due to these currents. Transistors 30 and 31 are also connected as a Darlington pair with their collector electrodes interconnected to resistor 22 of the weighting and coding network and the base electrode of transistor 30 connected to the emitter electrode of transistor 31. The emitter electrode of transistor 30 is connected to the emitter electrode of transistor 27. A speed-up and leakage current diode, similar to diode 29 discussed heretofore, is connected from the emitter electrode of transistor 31 to the base electrode of transistor 31, the latter of which is connected to the other output of driving circuit 3.

The base electrode of transistor 33, which is connected in a Darlington pair with transistor 34, is connected to the base electrode of transistor 31 and the driving circuit 3. The collector electrodes of transistors 33 and 34 are interconnected as are the emitter electrode of transistor 33 and the base electrode of transistor 34. The collector electrodes of transistors 33 and 34 are connected to resistor 25 of the weighting and coding network. A speed-up and current leakage diode 36 is connected for forward conduction from the base electrode of transistor 34 to the base electrode of transistor 33 for the reasons noted in connection with diode 29. The emitter electrode of transistor 37 of the fourth Darlington pair is connected to the emitter electrode of transistor 34. The collector electrodes of transistors 37 and 38 are connected to resistor 22 of the weighting and coding network. The emitter electrode of transistor 38 is connected to the base electrode of transistor 37 and the base electrode of transistor 38 is connected to the output of the driving circuit 3 to which the base electrode of transistor 28 is connected. Speed-up and leakage current diode 39 is connected in the forward conductivity direction from the emitter electrode to the base electrode of transistor 38, in the manner discussed heretofore in connection with diode 29.

Transistor 40 of the differential amplifier has its collector electrode connected to the emitter electrodes of transistors 27 and 30 and the collector electrode of transistor 16. The base electrode of transistor 40 is connected to ground and resistor 41 is connected to the emitter electrode of transistor 40. The collector electrode of transistor 42 is connected to the collector electrode of transistor 15 and the emitter electrodes of transistors 34 and 37. The base electrode of transistor 42 is connected to bias resistor 50 and via coupling capacitor 2 to the source of input signal 1. Resistor 43 connects the emitter electrode of transistor 42 to resistor 41. Resistors 41 and 43 may have equal values.

The bias circuit comprises transistors 44 and 45 and maintains a constant current at the junction of resistors 41 and 43 of the differential amplifier and resistors 7 and 8 of the dynamic bias control network. The collector electrode of transistor 44 is connected to the junction of resistors 41 and 43 and the collector electrode of transistor 45 is connected to the junction of resistors 7 and 8. Resistor 46 connects the base electrodes of both transistors 44 and 45 to ground, while resistor 47 connects the base electrodes of these transistors to a source of negative bias potential. Resistor 48 connects the emitter electrode of transistor 45 to the source of negative bias potential and resistor 49 connects the emitter electrode of transistor 44 to the negative bias potential source.

Before discussing the function of each of these components in detail, it is first useful to review briefly the function of each network in the overall current folder circuit of the drawing. The driving circuit 3 drives the differential switch at the polarity and frequency of the signal from the input source 1. The function of the differential switch is that of "folding," i.e., providing the single polarity input to the comparator 23, as illustrated in the drawing, regardless of the polarity of the source 1. The driving circuitry would be synchronized with the source 1 such that the polarity of the signal driving the differential switch would be the same in phase, polarity, and frequency as that of the source 1. One skilled in the art could readily develop a compatible circuit for this purpose as, for example, flip-flops which are zero set with the polarity and phase of the input signal to be coded.

The differential amplifier amplifies the input signal, the operation of this circuit, which is unbalanced in the configuration illustrated in the drawing, being well known in the art. The dynamic bias control circuit controls the collector current supplied to the differential amplifier transistors in accordance with the magnitude of the input signal, in a manner to be discussed in detail hereinafter. The bias circuit maintains constant currents at the junction of resistors 7 and 8 and at the junction of resistors 41 and 43. The longitudinal compensation circuit compensates for large voltage swings which may be translated from longitudinal to transverse voltages and thereby introduce error at the input of the comparator 23.

The coding of the analog input signal in the folding and coding circuit of the drawing is accomplished by comparing the voltages or currents proportional to the input analog signal with one of a plurality of reference voltages or currents generated by the weighting network. The results of this comparison are then fed to a logic circuit 26 for arrangement as a PCM code word. This weighting and coding network is well known to the art, as can be seen for example from the textual material at pages 583 through 585 of the text Transmission Systems for Communications, fourth edition, by Members of the Technical Staff — Bell Telephone Laboratories. More particularly, the current flow through resistors 22 and 25 is varied in accordance with the magnitude of the input signal, as discussed in detail hereinafter. The variations in the voltages across these resistors are compared with the reference voltage outputs of the weighting network by the comparator 25 and fed to the logic circuitry for coding as a PCM word. The weighting network 21 may be any compatible digital-to-analog converter as, for example, the resistive ladder and switching network shown in FIG. 25-13 at page 584 of the aforenoted Transmission Systems for Communications text. This network produces a number of voltages or currents at predetermined steps under the control of the logic circuit 26 until the voltage across the resistor 22 is greater than the sum of the voltages across weighting network 21 and resistor 25. The logic circuit then resets the weighting network and produces an output PCM word whereupon the process is repeated for the next input sample.

Before discussing the present circuit in further detail, it is first useful to explain briefly the need for dynamic biasing in the folder and coder circuit illustrated in the drawing. A circuit without dynamic bias would, of course, not include transistors 4, 9, 11, 12, 15, and 16 and the circuitry associated therewith in the dynamic bias control network. Also, transistor 45 and resistor 48 of the bias circuit would also not be required. Ignoring for the moment the longitudinal compensation circuit, and assuming that the junction of weighting network 21 and resistor 22 is connected directly to the source of positive bias potential, the resulting folder circuit would comprise the weighting and coding network, the differential switch, the differential amplifier, and the bias circuit. In the absence of an input signal to this circuit without dynamic bias, balanced and equal currents would flow from the source of positive potential at the top of the drawing to the source of negative potential at the bottom of the drawing through the two arms or paths, including resistors 22 and 25, which together form the main coding path. The left arm of this main coding path would comprise weighting network 21, resistor 25, transistors 27 and 28, transistor 40, resistor 41, and the collector-emitter path of transistor 44 and resistor 49 of the bias circuit to the source of negative bias potential. The right arm of this main coding path includes resistor 22, transistors 37 and 38, transistor 42, resistor 43, and the collector-emitter path of transistor 44 and resistor 49 of the bias circuit to the source of negative bias potential. As already discussed in connection with the present circuit, encoding in this modified circuit would also be accomplished by comparing the voltages and/or currents of the weighting network 21 and resistors 22 and 25. Also, as in the present circuit, the current at the junction of resistors 41 and 43 of the differential amplifier is maintained at a constant value by transistor 44 of the bias circuit.

In this circuit without dynamic bias, therefore, the sum of the currents in each arm of the coding path is always equal to the constant current maintained by transistor 44 of the bias circuit. Since the voltage error in the folding and coding process is limited to a voltage having a magnitude less than the voltage level of the lowest quantum level, the ΔR variation in the resistors 22 and 25 in the weighting and coding network must be limited to:

ΔR = smallest permissible voltage error/constant current bias where the relatively large magnitude of the constant bias current required is dictated by the biasing current necessary for peak signal magnitudes when substantially all of this current will flow through one or the other arms of the main coding path, depending on the polarity of the input signal, as discussed hereinafter. For the example of the 256 quantum level and 3 volt peak amplitude input signal used heretofore, this would require that resistors 22 and 25 have tolerances of 0.012 percent or better to limit the IΔR voltage error to acceptable levels. Similarly, resistors 41 and 43 of the differential amplifier must be chosen to have negligible ΔR variations, and transistors 27, 28, 30, 31, 33, 34, 37, and 38 of the differential switch must be chosen to have an essentially zero base current, lest unbalance in these currents unbalance the currents in each arm of the coding path and thereby introduce error. Resistors having tolerances of 0.012 percent and transistors having substantially zero base-emitter leakage currents are, however, not available at the present state of the art. The manner in which dynamic biasing is employed in the present invention relieves the need for these unobtainable components and, in fact, makes possible the construction of the present folder and coder circuit using thin film techniques.

The function of the dynamic biasing circuit in the present invention can be seen by first assuming that no (zero) input signal is present at the output of the input signal source 1. For this input signal condition, the $I_1$ current through the collector-emitter path of transistor 4 is approximately equal to the current $I_2$ through the collector-emitter path of transistor 9. As can be seen from the drawing, transistors 4 and 9 are connected as a differential amplifier with an unbalanced input, the operation of this circuit being known in the art. The current $I_3$ at the junction of resistors 7 and 8 is always equal to the sum of the currents $I_1$ and $I_2$ and is maintained constant by transistor 45 of the bias circuit which is connected for constant current operation. Resistors 5 and 10 are chosen to be substantially equal, hence the potential at the base electrodes of both transistors 11 and 12 is approximately equal. The potential at the base electrode of transistors 15 and 16, which are connected to the common emitter electrodes of transistors 11 and 12, is sufficiently low to enable conduction of current through these transistors. In the absence of an input signal, currents $I_4$ and $I_5$ are slightly less than $I_6$ and $I_7$ , respectively.

Transistors 40 and 42 of the differential amplifier also form an unbalanced differential amplifier circuit. In the absence of an input signal from the source 1, the currents $I_6$ and $I_7$ will therefore be equal as in the case of currents $I_1$ and $I_2$ of transistors 4 and 9 of the dynamic bias circuit. Transistor 44 of the bias circuit maintains current $I_8$ at a constant value which is the sum of the currents $I_6$ and $I_7$. The magnitude of current $I_8$ would be chosen in accordance with the desired current for the peak input signal of the source 1, as discussed heretofore in connection with the folding and coding circuit without dynamic bias. In this zero input signal condition the current $I_9$ in the left arm of the main coding path comprising weighting network 21 and resistor 25 is equal to the difference between current $I_6$ and the current $I_4$ and the current $I_{10}$ in the right arm of the main coding path comprising resistor 22 is equal to the difference between current $I_7$ and the current $I_5$.

In the presence of a peak magnitude input signal having a positive polarity, transistor 4 of the dynamic bias control network will be biased into deep conduction causing the current $I_1$ to increase appreciably. Since the sum of the currents at the junction of resistors 7 and 8 must be equal to $I_3$, the current $I_2$ through the collectoremitter path of transistor 9 will decrease in direct proportion to the increase of current $I_1$. The increase current flow $I_1$ causes the potential at the base electrode of transistor 11 to drop, while decreasing the current flow $I_2$ causes the potential at the base electrode of transistor 12 to increase. The base-emitter path of transistor 12 is thus biased into conduction and the potential at the emitter electrode of transistor 11 is sharply increased to the potential at the base electrode of transistor 12 minus the small base-emitter voltage drop across transistor 12. Transistor 11 is thus cut-off and transistor 12 is conductive. Current flows from the source of positive bias potential at the top of the drawing through the collector-emitter path of transistor 12 and resistor 13 to the source of negative potential connected to resistor 13. Transistors 15 and 16 have their base electrodes connected to the common emitter electrodes of transistors 11 and 12 and the increased positive potential at the emitter electrode of transistor 12 causes the currents $I_4$ and $I_5$ through the collector-emitter paths of transistors 16 and 15, respectively, to decrease. For the example of the peak input signal, the currents $I_4$ and $I_5$ would be reduced to a negligible value.

The presence of the peak magnitude positive input signal is also coupled to the base electrode of transistor 42 via capacitor 2. Increasing the potential at the base electrode of transistor 42 increases the current flow $I_7$ through the collector-emitter path of this transistor and decreases the current flow $I_6$ through the collector-emitter path of transistor 40, the current $I_8$ at the junction of resistors 41 and 43 being maintained constant by the transistor 44 of the bias circuit. As previously discussed, a peak magnitude positive input signal causes the currents $I_4$ and $I_5$ from the dynamic bias control circuit to be reduced to a substantially negligible value. In addition, the presence of a peak positive signal input causes the current $I_7$ to be approximately equal to the bias current $I_8$, the magnitude of which is chosen to approximate the bias current required for peak input signal conditions. Current $I_{10}$ is thus approximately equal to current $I_7$ and flows from the positive source of biasing potential through the collector-emitter path of transistor 20, through resistor 22 of the coding and weighting network, through transistors 37 and 38 of the differential switch, through the collector-emitter path of transistor 42 and resistor 43 of the differential amplifier, and through the collector-emitter path of transistor 44 and resistor 49 of the bias circuit to the source of negative bias potential. (Conduction through the transistors 37 and 38 of the differential switch would be initiated by the driving circuit 3 which, as noted heretofore, is synchronized and zero-set with the input source 1. Driving circuit 3 would also attempt to initiate conduction through the transistors 27 and 28 for the positive input signal condition, but, as noted heretofore, for a peak positive polarity signal the current $I_9$, which flows through these transistors, is negligible compared to $I_{10}$.)

A negative peak input signal from the source 1 to the base electrode of transistor 4 of the dynamic bias control circuit and transistor 42 of the differential amplifier reduces the collector-emitter current flow through each of these transistors. The current $I_1$ through transistor 4 thus decreases and the current $I_2$ through the collector-emitter path of transistor 9 increases by the amount of decrease of the current $I_1$. Since the sum of the currents $I_1$ and $I_2$ is equal to the current $I_3$, which is maintained constant by transistor 45, decreasing the current $I_1$ has the effect of increasing the potential at the base electrode of transistor 11 and biasing this transistor into conduction. Once transistor 11 is conductive, the potential at its base electrode less the small potential drop across its base-emitter junction is applied to the emitter electrode of transistor 12, back-biasing this transistor into cut-off. The positive potential at the emitter electrode of transistor 11 is applied to the base electrodes of transistors 15 and 16 reducing conduction through these transistors and the currents $I_4$ and $I_5$ to a negligible value.

The peak negative input signal applied to the base electrode of transistor 42 decreases the $I_7$ current flow through the collector-emitter path of this transistor and, since the current $I_5$ is negligible for the peak negative input signal, the current $I_{10}$ from the main coding and weighting network will also be negligible. Current in the folder and coder circuit for the peak negative input signal will therefore flow from the source of positive biasing potential at the top of the drawing through the collector-emitter path of transistor 20 of the longitudinal compensation circuit, through the weighting network 21 and resistor 25 of the weighting and coding network, through the transistors 27 and 28 of the differential switch, through the collector-emitter path of transistor 40 and resistor 41 of the differential amplifier, and through the collector-emitter path of transistor 44 and resistor 49 of the bias circuit to the negative source of bias potential. (Conduction through transistors 33 and 34 of the differential switch would be initiated by the driving circuit 3 in accordance with the polarity of the input signal. Driving circuit 3 would also attempt to initiate conduction through transistors 30 and 31 for the negative input signal condition, but, as noted heretofore, for a peak signal the current $I_{10}$, which flows through these transistors, is negligible. The differential switch thus keeps the current flow through resistors 22 and 25 and the weighting network 21 of the weighting and coding network in one direction regardless of the polarity of the input signal, i.e., the polarity of the potential appearing across the input terminals of the comparator 23 is always the same.)

For either positive or negative peak input signals, therefore, the currents through the arms of the main coding path are substantially the same as would occur in folder and current circuits wherein dynamic biasing is not employed. Since the input magnitudes are large, however, the current proportional errors introduced by resistor tolerances and transistor base currents are proportionally small and introduce very little error in the coding or quantizing process. The advantages obtained by dynamic bias are therefore obtained for input signals having less than the peak magnitudes and particularly for signals having relatively low magnitudes. This will be easily seen by assuming that a relatively small magnitude input signal is present at the input source 1.

The presence of a small magnitude positive signal at the input source 1 will increase the current $I_1$ through the collector-emitter path of transistor 4 and proportionally decrease the current $I_2$ through the collector-emitter path of transistor 9. Increasing the current flow $I_1$ causes the potential at the base electrodes of transistor 11 to decrease, and decreasing the current $I_2$ causes the potential at the base electrode of transistor 12 to increase. The increased potential at the base of transistor 12, less the base-emitter voltage drop of this transistor, is applied to the emitter electrode of transistor 11 to terminate conduction through transistor 11. Although the d.c. levels of the signal appearing at the emitter electrode of transistor 12 are fixed, with respect to the d.c. level of the input signal, the pulsating signal appearing at the emitter electrode of transistor 12 is nonetheless proportional to the magnitude of the input signal. The currents flowing through transistors 15 and 16, $I_4$ and $I_5$, are thus inversely proportional to the potential at the emitter electrodes of transistors 11 and 12 which is in turn proportional to the magnitude of the input signal.

In this example of a small magnitude positive signal at the input source 1, the presence of this signal at the base electrode of transistor 42 in the differential amplifier will increase the current flow $I_7$ through the collector-emitter path of transistor 42 and decrease the current flow $I_6$ through the collector-emitter path of transistor 42 of the differential amplifier proportionally. The current $I_7$ through the collector-emitter path of transistor 42 is the sum of the currents $I_5$ and $I_{10}$, while the current $I_6$ through the collector-emitter path of transistor 40 will be the sum of the currents $I_4$ and $I_9$. Since the current $I_8$ is maintained constant by transistor 44 of the bias circuit, the sum of the currents $I_6$ and $I_7$ will be equal to this current. Supplementing the currents $I_9$ and $I_{10}$ flowing into the weighting and coding network with the currents $I_4$ and $I_5$ for the small magnitude input signal achieves several advantages. First, the currents through resistors 22 and 25 of each arm of the weighting and coding network are not constrained to be equal the constant bias current $I_8$ which must be chosen for peak signal conditions. Instead, the currents $I_9$ and $I_{10}$ are proportional to only the instantaneous magnitude of the input and weighting network reference signals, hence the $I\Delta R$ error due to resistors 22 and 25 is in the same relative proportion to the magnitude of the small input signal as the proportion of the magnitude of the $I\Delta R$ error in the presence of a large input signal magnitude. Since the relative proportions of the errors to the input signal magnitudes are the same, the errors are readily tolerated for all input signal magnitudes as opposed to a folder and coder circuit without dynamic bias and which can only tolerate errors when the input signal magnitude is large. Resistors 22 and 25 of the present folder and coder circuit need therefore only have tolerances of readily available commercial components and may in fact be fabricated using thin film technology. A second advantage of this dynamic bias arrangement is that since the currents in the main coding path, $I_9$ and $I_{10}$, are proportional to the input signal, the base currents of the transistors in the differential switch are reduced proportionally to the reduction in the currents in the main coding path thereby also reducing this error to acceptable levels. A third, and perhaps most significant advantage of this dynamic biasing arrangement is that the insertion of the currents at the collector electrodes of the differential amplifier enables the gain of the differential amplifier transistors to be kept relatively constant, as compared to an alternate arrangement in my copending application, Ser. No. 340,267 filed on Mar. 12, 1973, concurrently with this application, wherein the dynamic bias is obtained by controlling the collector-emitter current flow through the transistors of the differential amplifier.

An input signal of less than peak magnitude having a negative polarity will be folded and coded in the same manner as a positive input signal of less than peak magnitude. For a negative input signal the current $I_1$ of the dynamic bias circuit will decrease and the current $I_2$ will increase proportionally. Transistor 11 will be biased into conduction, cutting off transistor 12, and the collector-emitter currents $I_4$ and $I_5$ through transistors 15 and 16 will be proportional to the magnitude of the input signal. The current $I_7$, through the collector-emitter path of transistor 42 of the differential amplifier will decrease and the collector-emitter current $I_6$, through the collector-emitter path of transistor 40, will increase. The current $I_6$ is supplied from both currents $I_4$ and $I_9$, and the current $I_7$ is the sum of the currents $I_7$ and $I_{10}$, all of the currents $I_4$, $I_5$, $I_6$, $I_7$, $I_9$, and $I_{10}$ being proportional to the magnitude of the input signal. Each of the advantages noted heretofore that are obtained with an input signal of positive polarity are thus also obtained with an input signal of negative polarity.

The longitudinal compensation circuit compensates for the large voltage swings which may be translated from longitudinal to transverse voltages and thus introduce error at the input of comparator 23. If, for exemplary purposes, it is assumed that a large positive or negative input signal is present at the source 1, then, as discussed heretofore, either the current flow $I_9$ or $I_{10}$ through the coding and weighting network sharply increases. This sharp increase in current demand from the source of positive bias potential flows through the collector-emitter path of transistor 20 of the longitudinal compensation circuit. (As discussed heretofore, the currents $I_4$ and $I_5$ through transistors 15 and 16 of the dynamic bias control network decreases to a negligible value in the event of a peak input signal, hence the current flow through the resistor 19 of the longitudinal compensation circuit also falls to a negligible value increasing the positive potential at the base of transistor 20.) The increased potential at the base of transistor 20 forces an increase in potential at the emitter of transistor 20 and tends to cancel the longitudinal voltage generated by the increase in potential across resistors 22 and 25 caused by an increase in currents $I_9$ or $I_{10}$. Hence the voltage at the common node formed by the interconnection of the emitter electrode of transistor 20, weighting network 21, and resistor 22 is raised in magnitude to a value closer to the magnitude of the source of positive bias potential than the potential at the common node prior to the application of the increased input signal. The abrupt change in potential across either resistor 22 or 25 due to the increased current surge caused by the presence of a large input signal magnitude is thus offset by the rise in potential at the aforenoted common node. The average voltage at the common node is thus kept relatively constant and the comparison at comparator 23 of the voltages across and the currents through weighting network 21, resistor 22, and resistor 25, is due solely to the change in current in one or the other arms of the main coding path. Longitudinal to transverse voltage conversion, and the error associated therewith is thereby substantially avoided.

Although the dynamic bias control circuit of the present invention is shown with an unbalanced differential amplifier, this arrangement could obviously also be used with a balanced differential amplifier simply by coupling the base of transistor 9 to the second source of input signal applied to the base of transistor 40 of the differential amplifier. In addition, although the differential amplifier and dynamic bias circuit is illustrated for present purposes in a folder and coder environment, it could just as easily be used in any application wherein dynamic biasing is required. For example, the circuit could be used in an "unfolder" circuit with the weighting network 21 interchanged with the input source 1 and the comparator 23 replaced by a differential operational amplifier. In this case the coupling capacitor 2 would be eliminated.

The above-described arrangement is illustrative of the application of the principles of the invention. Other embodiments may be devised by those skilled in the art without departing from the spirit and scope thereof.

What is claimed is:

1. A dynamically biased amplifier comprising first and second transistors, d.c. biasing means connected with the base and emitter electrodes of each of said first and second transistors for operation as a differential amplifier, the base electrode of at least one of said first and second transistors being additionally connected to an input signal to be differentially amplified, a source of bias potential, means for connecting the collector-emitter paths of said first and second transistors in parallel and for connecting the parallel combination to said source of bias potential thereby providing currents to the collector-emitter paths of said first and second transistors, dynamic biasing means connected to said source of bias potential and to the collector-emitter paths of each of said first and second transistors to provide additional currents to the collector-emitter paths of said first and second transistors, and means connecting said dynamic biasing means to said input signal to control the magnitude of the additional current supplied to the collector-emitter paths of said first and second transistors in accordance with the magnitude of the input signal.

2. A dynamically biased amplifier in accordance with claim 1 wherein said first and second transistors are connected with said d.c. biasing means and a single input signal as an unbalanced differential amplifier.

3. A dynamically biased amplifier in accordance with claim 1 wherein the magnitude of the additional current supplied to the collector-emitter paths of said first and second transistors varies inversely with the magnitude of said input signal.

4. A dynamically biased amplifier comprising first and second transistors, d.c. biasing means connected to the base and emitter electrodes of each of said first and second transistors to bias said first and second transistors for operation as a differential amplifier, a source of input signal to be differentially amplified connected to the base electrode of said first transistor, a third transistor, a source of bias potential, means for connecting the collector-emitter paths of said first and second transistor in parallel and for connecting the parallel combination to said source of bias potential thereby providing currents to the collector-emitter paths of said first and second transistors, means connecting the collector-emitter path of said third transistor between said source of bias potential and the collector-emitter path of said first transistor to provide additional current to the collector-emitter path of said first transistor, a fourth transistor having its collector-emitter path connected between said source of bias potential and the collector-emitter path of said second transistor to provide aadditional current to the collector emitter path of said second transistor, and means connecting the base electrode of said third and fourth transistors to said source of input signal to control the magnitude of the additional current supplied to the collector-emitter paths of said first and second transistors in accordance with the magnitude of the input signal.

5. A dynamically biased amplifier in accordance with claim 4 wherein said means connecting the base electrodes of said third and fourth transistors to said source of input signal includes a differential amplifier having at least one transistor connected to said source of input signal.

6. A dynamically biased amplifier in accordance with claim 4 wherein a bias circuit comprising a transistor connected to maintain a constant current is serially connected with said source of bias potential and the collector-emitter paths of said first and second transistors, the sum of the currents flowing from said source of bias potential to the collector-emitter paths of said first and second transistors and the additional currents supplied to the collector-emitter paths of said first and second transistor being equal to the constant current of said bias circuit.

7. A current folder and coder circuit comprising an unbalanced differential amplifier, a weighting and coding network connected to a comparator and logic circuit to control the reference signal from said weighting and coding network in accordance with the signal at the input of said comparator, a differential switch, a bias circuit which maintains a constant current flow therethrough, a source of biasing potential, means serially connecting said source of biasing potential, said weighting and coding network, said differential switch, said unbalanced differential amplifier, and said biasing circuit, a source of input signal, driving circuit means connected with a source of input signal and said differential switch to drive said differential switch in polarity and frequency synchronism with said input signal, a dynamic bias control network connected to said source of bias potential and said unbalanced differential amplifier to provide additional current to said unbalanced differential amplifier, and means connecting said dynamic bias control network to said source of input signal to control the magnitude of the additional current supplied to said unbalanced differential amplifier in accordance with the magnitude of said input signal.

8. A current folder and coder circuit comprising an unbalanced differential amplifier in accordance with claim 7 wherein a longitudinal compensation circuit is connected between said source of biasing potential and said weighting and coding network to compensate for the large voltage swings across said weighting and coding network in response to a large magnitude input signal.

9. A current folder and coder circuit comprising an unbalanced differential amplifier in accordance with claim 7 wherein said unbalanced differential amplifier comprises first and second transistors biased for operation as a differential amplifier, means connecting the base electrode of said first transistor to said source of input signal, means connecting the collector-emitter paths of said first and second transistors in series with the differential switch and said weighting and coding network to said source of bias potential in a main coding path, means connecting the emitter electrodes of said first and second transistors to said bias circuit, said dynamic bias control network including third and fourth transistors, means connecting the collector-emitter path of said third transistor between said source of bias potential and the collector-emitter path of said first transistor of said unbalanced differential amplifier, means connecting the collector-emitter path of said fourth transistor between said source of bias potential and the collector-emitter path of said second transistor, and means connecting the base electrodes of said third and fourth transistors to said source of input signal.

10. A current folder and coder circuit comprising an unbalanced differential amplifier in accordance with claim 9 wherein said means connecting the base electrodes of said third and fourth transistors to said source of input signal includes an unbalanced differential amplifier comprising fifth and sixth transistors, d.c. biasing means connected with the base and emitter electrodes of each of said fifth and sixth transistors, the base electrodes of said fifth transistor being connected to said source of input signal, means serially connecting the collector-emitter paths of said fifth and sixth transistors with said source of biasing potential, means connecting the base electrode of said third transistor with the collector-emitter path of said fifth transistor, and means connecting the base electrode of said fourth transistor with the collector-emitter path of said sixth transistor.

11. A current folder and coder circuit comprising an unbalanced differential amplifier in accordance with claim 10 wherein said means connecting the base electrode of said third transistor to the collector-emitter path of said fifth transistor comprises a seventh transistor and said means connecting the base electrode of said fourth transistor to the collector-emitter path of said sixth transistor comprises an eighth transistor, the base electrode of said seventh transistor being connected to the collector-emitter path of said fifth transistor, the collector-emitter path of said seventh transistor being connected to said source of bias potential, the base electrode of said eighth transistor being connected to the collector-emitter path of said sixth transistor, the collector-emitter path of said eighth transistor being connected to said source of bias potential, and means interconnecting the emitter electrodes of said seventh and eighth transistors and the base electrodes of said third and fourth transistors.

12. A coder circuit comprising an unbalanced differential amplifier, a weighting and coding network connected to a comparator and logic circuit to control the reference signal from said weighting and coding network in accordance with the signal at the input of said comparator, a biasing circuit which maintains a constant current flow therethrough, a source of biasing potential, means serially connecting said source of biasing potential, said weighting and coding network, said unbalanced differential amplifier, and said biasing circuit, a source of input signal, a dynamic bias control network connected to said source of bias potential and said unbalanced differential amplifier to provide additional current to said unbalanced differential amplifier, and means connecting said dynamic bias control network to said source of input signal to control the magnitude of the additional current supplied to said unbalanced differential amplifier in accordance with the magnitude of said input signal.

* * * * *